United States Patent [19]

Wang

[11] Patent Number: 5,540,959
[45] Date of Patent: Jul. 30, 1996

[54] PROCESS FOR PREPARING A COATED SUBSTRATE

[75] Inventor: Xingwu Wang, Alfred, N.Y.

[73] Assignee: Howard J. Greenwald, East Rochester, N.Y.

[21] Appl. No.: 393,545

[22] Filed: Feb. 21, 1995

[51] Int. Cl.$^6$ ............................................. B05D 3/04
[52] U.S. Cl. ...................... 427/561; 427/248.1; 427/379; 427/430.1; 427/585; 427/591; 427/595
[58] Field of Search ....................................... 427/562, 564, 427/576, 591, 190, 372.2, 561, 585, 595, 379, 248.1, 430.1; 428/336, 338, 688

Primary Examiner—Bernard D. Pianalto
Attorney, Agent, or Firm—Howard J. Greenwald

[57] ABSTRACT

A process for preparing a coated substrate in which mist particles are created from a dilute liquid, the mist particles are contacted with a pressurized carrier gas and contacted with radio frequency energy while being heated to form a vapor, and the vapor is then deposited onto a substrate. The coated substrate is then heated to a temperature of 450 to 1,400 degrees centigrade for at least ten minutes.

15 Claims, 10 Drawing Sheets

5,540,959

PROCESS FOR PREPARING A COATED SUBSTRATE

FIELD OF THE INVENTION

An atmospheric process for coating films onto substrates which utilizes plasma vapor.

BACKGROUND OF THE INVENTION

Processes for making films of oxide materials by radio frequency (RF) plasma fabrication techniques are well known to those skilled in the art; the films so produced generally have thicknesses of from 0.1 to 20 micrometers.

These prior art plasma fabrication techniques are described in U.S. Pat. Nos. 5,366,770 of Wang, 5,260,105 of Wang, 5,364,562 of Wang, 5,157,015 of Snyder, Wang and Zhong, 5,120,703 of Snyder, Wang and Zhong, 5,213,851 of Snyder, Simmons and Wang, and 5,100,868 of Snyder, Hermann, Wang, Duan and Hao. The disclosure of each of these United States patents is hereby incorporated by reference into this specification.

It does not appear that any of prior art plasma coating processes is capable of readily producing coated products whose densities may be varied from about 50 percent to 100 percent; in most of the prior art plasma processes, the density of the coated film is from about 80 to about 90 percent.

Furthermore, the prior art plasma coating processes were not capable of producing oxide films with a substantially uniform surface morphology. Furthermore, the prior art processes were not capable of readily varying the surface morphology of the coated product.

In addition the prior art plasma coating processes do not produce columnar film growth, or vary the extent to which columnar film growth occurs. The prior art processes, in general, only produced agglomerate film growth.

The prior art plasma processes produced coated films which were substantially crystalline. They were not capable, however, of producing films which were substantially amorphous.

Furthermore, the prior art processes were not capable of producing coated films which would completely transmit visible light.

It is an object of this invention to provide a process which is capable of readily producing coated products whose densities may be varied from about 50 percent to 100 percent.

It is yet another object of this invention to provide a coating process which can produce oxide films with a substantially uniform surface morphology.

It is yet another object of this invention to provide a coating process which is capable of readily varying the surface morphology of the coated product.

It is yet another object of this invention to provide a coating process which is capable of producing columnar film growth and, additionally, varying the extent to which columnar film growth occurs.

It is yet another object of this invention to provide a coating process which is capable of producing coated films which are substantially amorphous.

It is yet another object of this invention to provide a process which is capable of producing coated films which will completely transmit visible light.

It is yet another object of this invention to provide a coating process adapted to deposit films on irregularly-shaped substrates, such as tubular substrates of fibers.

It is yet another object of this invention to provide a coating process which is capable of fabricating films which are electrically conductive and whose electrical conductivity can be varied.

SUMMARY OF THE INVENTION

In accordance with this invention, there is provided an atmospheric process for the production of a coating or film. In the first step of this process, an aerosol mist is subjected to radio frequency radiation while in the plasma region. Thereafter, the vaporized mixture is deposited onto a substrate. Thereafter, the coated substrate is subjected to a heat-treatment cycle.

BRIEF DESCRIPTION OF THE DRAWINGS

The present invention will be more fully understood by reference to the following detailed description thereof, when read in conjunction with the attached drawings, wherein like reference numerals refer to like elements, and wherein.

DESCRIPTION OF THE PREFERRED EMBODIMENTS

Figure 1:
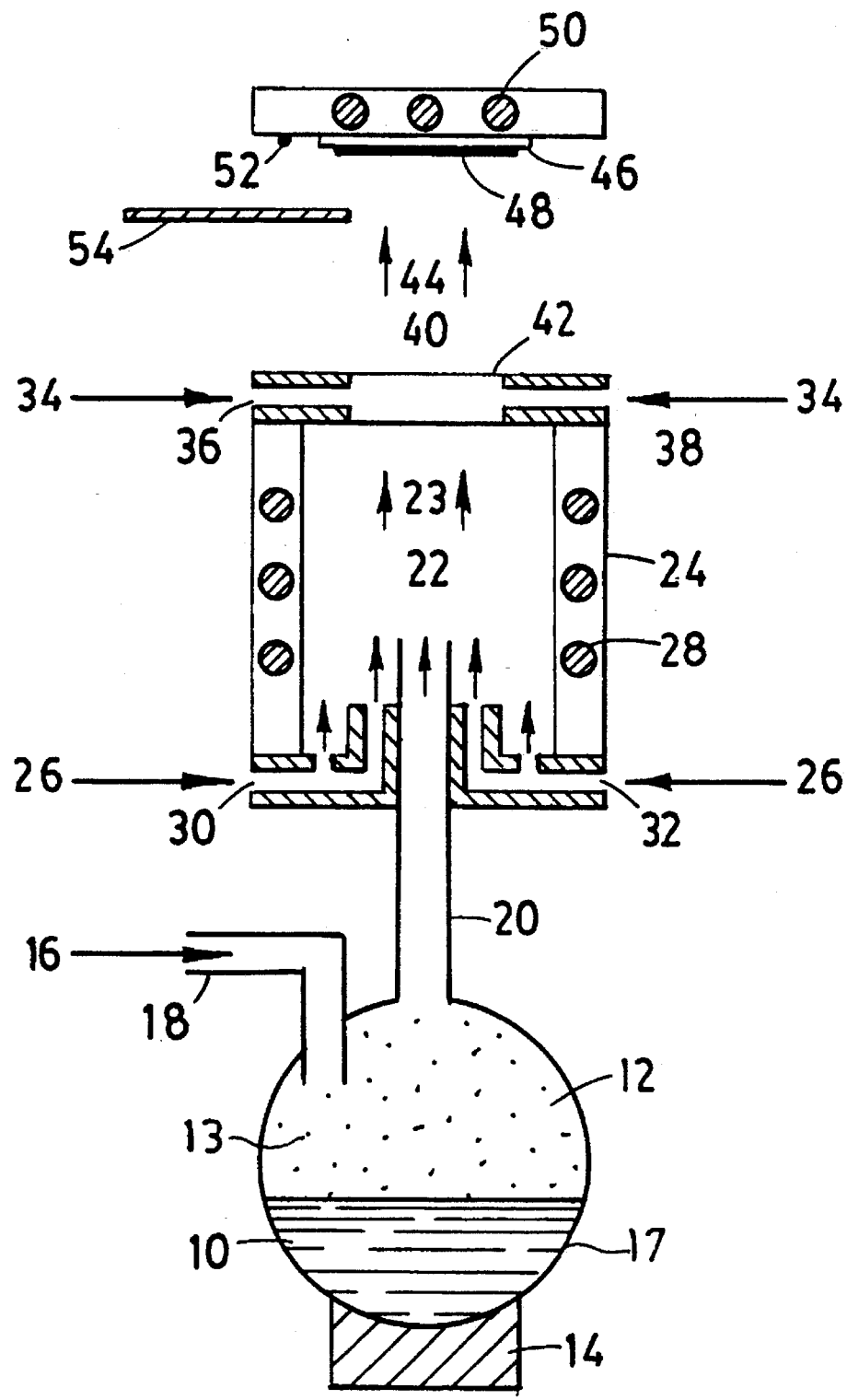
FIG. 1 is a schematic system diagram illustrating a portion of one preferred embodiment of the invention.

FIG. 1 partially illustrates a preferred embodiment of applicant's process; the heating treating portion of the process is illustrated in another Figure.

Referring to FIG. 1, and in the preferred embodiment illustrated therein, a mist-forming liquid 10 of reagents is charged into misting chamber 12.

It has been found that substantially any liquid which will form a mist upon the application of energy can be used in the process of this invention. The liquid may be partially or completely aqueous, it may be partially or completely non-aqueous, it may be partially or completely in the form of a solution, it may be partially or completely in the form of a slurry, etc.

The liquid 10 preferably contains one or more compounds in either associated or disassociated form. Thus, by way of illustration, the liquid 10 may, e.g., contain yttrium nitrate, yttrium ions, nitrate ions, and mixtures thereof. As will be apparent to those skilled in the art, regardless of the form that such compound(s) are in, their components will be present in a stoichiometry adapted to produce a coating with the desired concentration of such compound(s).

The nature of the reagents charged into misting chamber 12 will be discussed further in another portion of this specification. In the remainder of this specification, while illustrating the process, reference will be made to "solution 10" for the sake of simplicity of discussion, it being recognized that other liquids which are not solutions also may be used.

Referring again to FIG. 1, the solution 10 in misting chamber 12 is preferably caused to form into an aerosol, such as mist 13.

The term aerosol, as utilized in this specification, refers to a suspension of ultramicroscopic solid or liquid particles in air or gas, such as smoke, fog, or mist. See, e.g., page 15 of "A dictionary of mining, mineral, and related terms", edited by Paul W. Thrush, (U.S. Department of the Interior, Bureau of Mines, 1968).

In general, any of the devices for producing aerosol mists, and/or the aerosol mists so produced, which are known to those skilled in the art may be used in the process of this invention. Thus, by way of illustration and not limitation, one may use the aerosol mists and/or devices disclosed in U.S. Pat. Nos. 5,376,144 (cellulosic cross-linking agent), 5,364,551, 5,267,555, 5,250,716 (copper chloride mist), 5,198,206 (sulfuric acid mist), 5,170,782 (mist generator produced by Devilbiss Health Care Inc.), 5,152,457 (mist generator), 5,145,113 (ultrasonic mist generator), 4,603,193 (mist-forming aqueous solutions of reactant salts), 4,171,777 (jet nozzle for producing aerosol mist), 3,974,941, and the like. The disclosure of each of these United States patents is hereby incorporated by reference into this specification.

The aerosol mist preferably is comprised or consists essentially of aerosol particles having diameters of from about 0.1 to about 100 microns and, more preferably, having diameters of less than about 10 microns.

The aerosol mist preferably consists of gas and suspended liquid particles with diameters less than 10 microns; it may be produced from solution 10 by any conventional means which causes sufficient mechanical disturbance of said solution. Thus, one may use mechanical vibration. In one preferred embodiment, ultrasonic means are utilized to mist solution 10.

As is known to those skilled in the art, ultrasonic sound waves (those having frequencies above 20,000 Hertz) may be utilized to mechanically disturb solutions and cause them to mist. Thus, by way of illustration, one may use the ultrasonic nebulizer, model number 99, sold by the DeVilbiss Health Care, Inc. of Somerset, Pa.; see, e.g., the Instruction Manual for the "Ultra-Neb 99 Ultrasonic Nebulizer", Publication A-850-C, published by DeVilbiss Health Care, Inc.

Referring again to FIG. 1, and in the embodiment shown in therein, the ultrasonic nebulizer 14 is shown contacting an exterior surface 17 of misting chamber 12. In this embodiment, the ultrasonic waves produced by the nebulizer are transmitted via the walls of the misting chamber 12 and effect the misting of solution 10.

In another embodiment, not shown, the ultrasonic nebulizer 14 is in direct contact with solution 10.

Figure 2:
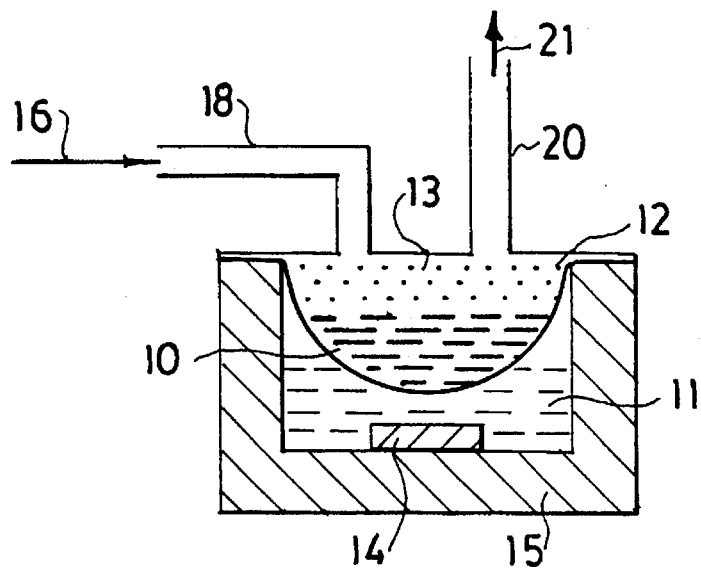
FIG. 2 is a schematic diagram illustrating a portion of another preferred embodiment of the invention.

In yet another embodiment, illustrated in FIG. 2, the ultrasonic nebulizer 14 is in direct contact with an intermediate medium 11. Through this intermediate medium 11, the ultrasonic nebulizer 14 is then coupled to solution 10. Excited by the ultrasonic oscillation, mist 13 is generated.

In yet another preferred embodiment, illustrated in FIG. 2, the intermediate medium 11 is distilled water.

In yet another preferred embodiment, the medium 11 is deionized water.

It is preferred that the ultrasonic power utilized with such ultrasonic vibration machine is in excess of one Watt and more preferably, in excess of 10 Watts. In one embodiment, the ultrasonic power utilized in such machine exceeds 50 Watts.

In one preferred embodiment, solution 10 is caused to mist at a rate of from 0.5 to 20 milliliters per minute. In a more preferred embodiment, the misting rate of solution 10 is from 1.0 to 3.0 milliliters per minute.

Referring again to FIG. 1, during the time solution 10 is being caused to mist, it is preferred to provide carrier gas 16 through carrier gas inlet 18.

When carrier gas 16 applies pressure to solution 10 and mist 13, carrier gas 16 is in contact with solution 10 and mist 13. It is preferred that a sufficient amount of carrier gas 16 is introduced into the system through carrier gas inlet 18, at a sufficiently high flow rate so that pressure in the mist chamber 12 is in excess of atmospheric pressure. Thus, for example, in one embodiment wherein chamber 12 has a volume of about 200 cubic centimeters, the flow rate of the carrier gas is from 100 to 150 milliliters per minute.

Substantially any gas may be utilized as carrier gas 16. In one preferred embodiment, a gas which facilitates the formation of plasma may be utilized as carrier gas 16.

As is known to those skilled in the art, the term plasma refers to a gas containing equal amounts of positively and negatively charged particles.

One may use many of the plasma gases known to those skilled in the art. Thus, by way of illustration and not limitation, one may use one or more of the plasma gases disclosed in U.S. Pat. Nos. 5,376,591, 5,376,332 (argon, helium, and hydrogen), 5,376,224, 5,374,327, 5,372,862, 5,372,799, 5,372,674 (plasma chemical etch), 5,370,767 (helium and chlorine), 5,369,947 (plasma reactor), 5,369,337, 5,369,336 (helium, plasma generator), 5,369,241 (argon and helium), and the like. The disclosure of each of these United States patents is hereby incorporated by reference into this specification.

By way of further illustration, one may utilize oxygen, air, argon, nitrogen, hydrogen, and the like. It is preferred that the carrier gas used in the system be a compressed gas under a pressure in excess 760 millimeters of mercury. In this embodiment, the use of the compressed gas facilitates the movement of the mist 13 from the misting chamber 12 to the plasma region 22.

In a more preferred embodiment, the pressure of the compressed gas is in excess of 780 millimeters of mercury. In general, it is preferred to use compressed gas at a pressure of from about 780 to about 850 millimeters of mercury, absolute.

Referring again to FIG. 1, the misting container 12 may be any reaction chamber conventionally utilized by those skilled in the art and should preferably be constructed out of acid resistant materials such as plastic, glass, stainless steel, and the like.

Mist 13 from misting chamber 12 is fed via misting outlet line 20 into plasma region 22 of plasma reactor 24. In plasma region 22, mist 13 is mixed with plasma generated by plasma gas 26 and subjected to radio frequency radiation provided by radio frequency coil 28.

Referring again to FIG. 1, plasma reactor 24 provides energy to form plasma and to cause the plasma to react with mist 13. Any of the plasma reactors well known to those skilled in the art may be utilized as plasma reactor 24. Some of these plasma reactors are described in "Plasma Deposited Thin Films" by J. Mort, et al. (CRC Press, Inc., Boca Raton, Fla., 1986). Reference also may be had to "Methods of Experimental Physics", Volume 9, Parts A and B, Plasma Physics, (Academic Press, New York, 1970/1971); and "Glow Discharge Nitriding of Oxides" by N. H. Burlingame, Ph.D. thesis (Alfred University, Alfred, N.Y., 1985), available from University Microfilm International, Ann Arbor, Mich.

In one preferred embodiment, plasma reactor 24 is a "model 56 torch" available from the TAFA Inc. of Concord, N.H. It is preferably operated at a frequency of approximately 4 megahertz and an input power of 30 kilowatts.

Referring again to FIG. 1, plasma gas 26 is fed into feeding lines 30 and 32. As is known to those skilled in the art, a plasma can be produced by passing plasma gas into a plasma reactor. A discussion of the formation of plasma is contained in B. Chapman's "Glow Discharge Processes", (John Wiley & Sons, New York, 1980).

In one preferred embodiment, plasma gas 26 is pure argon. In another embodiment, plasma gas 26 is a mixture of argon and oxygen. In yet another embodiment, plasma gas 26 is pure nitrogen. In yet another embodiment, plasma gas 26 is a mixture of nitrogen and oxygen. In yet another embodiment, plasma gas 26 is a mixture of argon and hydrogen.

When plasma gas 26 is pure argon or pure nitrogen, it is preferred to introduce plasma gas 26 into plasma reactor 24 at a flow rate of from 5 to 30 liters per minute.

When a mixture of oxygen and either argon or nitrogen is utilized, the concentration of oxygen in the mixture should preferably be from 1 to 40 volume percent and, more preferably, from 15 to 25 volume percent. When such a mixture is utilized, the flow rates of each gas in the mixture should be adjusted to obtain the desired gas concentrations. Thus, by way of illustration, in one embodiment which uses a mixture of argon and oxygen, the argon flow rate is 15 liters per minute, and the oxygen flow rate is 5 liters per minute.

In one embodiment, auxiliary oxygen 34 is fed into the top of reactor 24, between plasma region 22 and flame region 40, via feeding lines 36 and 38. In this embodiment, auxiliary oxygen 34 is not involved in the formation of plasma, but is involved in the enhancement of the oxidation of the material to be deposited on substrate 46.

A radio frequency alternating current energy is applied to the reagents in the plasma reactor 24, and it causes vaporization of the mist. It is preferred to apply this radio frequency energy at a frequency of from 100 to 30,000 kilohertz. In one embodiment, the radio frequency utilized is from 1 to 20 megahertz. In another embodiment, the radio frequency utilized is from 3 to 5 megahertz.

As is known to those skilled in the art, such radio frequency alternating currents may be produced by conventional radio frequency generators. Thus, by way of illustration, one may use one or more of the radio frequency generators described in U.S. Pat. Nos. 5,356,936, 5,339,039 (Langmuir system), 5,326,584, 5,325,021, 5,304,279, 5,302, 420 (plasma power of 100 to 1,000 watts and a carrier gas pressure of 10 to 180 milliTorr), 5,292,400, 5,292,370, 5,290,382, and the like. The disclosure of each of these United States patents is hereby incorporated by reference into this specification.

In one embodiment, a "model 56 torch" (manufactured by TAFA, Inc.) is attached to a radio frequency generator rated for operation at 35 kilowatts (which is manufactured by Lepel Company, a division of TAFA Inc.) and which generates an alternating current with a frequency of 4 megahertz at a power input of 30 kilowatts. Thus, e.g., one may utilize an induction coil driven at 2.5–5.0 megahertz, which is sold as the "PLASMOC 2" by ENI Power Systems, Inc. of Rochester, N.Y.

The use of these types of radio frequency generator is described in, e.g., Ph.D. theses entitled (1) "Heat Transfer Mechanisms in High Temperature Plasma Processing of Glasses" by Donald M. McPherson (Alfred University, Alfred, N.Y., January, 1988) and (2) the aforementioned N. H. Burlingame's "Glow Discharge Nitriding of Oxides".

Referring again to FIG. 1, plasma vapor 23 formed in plasma reactor 24 is allowed to exit via aperture 42 and can be visualized in flame region 40. In this region 40, the plasma contacts air which is at a lower temperature than that of plasma region 22, and a flame is visible. A theoretical model of the plasma/flame is presented on pages 88 et seq. of said McPherson thesis. Other theoretical models of the plasma in reactor 24 can be found in (1) "Two-dimensional Electromagnetic Field Effects in Induction Plasma Modeling" by J. Mostaghimi, et al., in "Plasma Chemistry and Plasma Processing", Volume 9, No. 1, 1989, pages 25–44; (2) "Radio-frequency Induction Plasmas at Atmospheric Pressure: Mixtures of Hydrogen, Nitrogen, and Oxygen with Argon" by S. L. Girshick, et al., in "Plasma Chemistry and Plasma Processing, Volume 10, No. 4, 1990, pages 515–529; and (3) "Modeling inductively coupled plasmas: The coil current boundary condition" by B. W. Wu, et al., in "Journal of Applied Physics", Volume 69, No. 2, 1991, pages 656–661.

Referring again to FIG. 1, the vapor 44 present in flame region 40 is propelled upward towards substrate 46. Any material onto which vapor 44 will condense may be utilized as a substrate. Thus, by way of illustration, one may use materials such as, metal, ceramic, glass, plastic, and the like.

In one preferred embodiment, substrate 46 consists essentially of a magnesium oxide material such as single crystal magnesium oxide, polycrystalline magnesium oxide, and the like.

In another embodiment, substrate 46 consists essentially of zirconia such as, e.g., yttrium stabilized cubic zirconia. The material in the substrate may be in a single crystalline form, or in a polycrystalline form.

In yet another embodiment, substrate 46 consists essentially of a material selected from the group consisting of strontium titanate, nickel foil, copper, stainless steel, alumina, sapphire, and the like.

In yet another embodiment, substrate 46 consists essentially of a material selected from the group consisting of soda lime silicate float glass, dealkalized soda lime silicate float glass, glass ceramics, and the like.

In yet another embodiment, substrate 46 consists essentially of a plastic material.

In yet another embodiment, substrate 46 consists essentially of semiconductive or insulative material.

In yet another embodiment, substrate 46 consists essentially of superconductive material.

By way of further illustration and not limitation, one may use one or more of the substrates disclosed in U.S. Pat. Nos.

5,372,958 (insulating substrate), 5,372,836 (glass), 5,372,799, 5,372,648, 5,371,944 (metallic substrate), 5,370,912, 5,369,336, 5,368,939 (titanium compound), 5,368,937, 5,368,897, 5,366,586, 5,364,665, 5,364,496, 5,362,686 (semiconductor substrate), 5,360,745 (heat resistant substrate), and the like. The disclosure of each of these United States patents is hereby incorporated by reference into this specification.

Referring again to FIG. 1, substrate 46 can be in various shapes and forms. Thus, by way of illustration, in one embodiment, substrate 46 is substantially flat. In another embodiment, substrate 46 is tubular shaped. In yet another embodiment, substrate 46 is one or more fibers. In yet another embodiment, substrate 46 is a collection of powders.

Substrate 46 can have different densities and porosities. Thus, by way of illustration, in one embodiment, substrate 46 is one hundred percent dense, without any pores. In another embodiment, substrate 46 is 90% dense, with 10% porosity. In yet another embodiment, substrate 46 is 80% dense, with 20% porosity. In yet another embodiment, substrate 46 is 70% dense, with 30% porosity. In yet another embodiment, substrate 46 is 60% dense, with 40% porosity. In yet another embodiment, substrate 46 is 50% dense, with 50% porosity.

In one preferred embodiment, substrate 46 consists essentially of a single crystalline material. In this embodiment, the film or coating deposited onto the substrate may be aligned in accordance with the substrate alignment.

As used in this specification, the term "single crystalline" or "single crystal" refers to a material with a periodicity which extends throughout the entire mass of the material. As is known to those skilled in the art, in crystalline solids the atoms or molecules are staked in a regular manner, forming a three dimensional pattern which may be obtained by a three dimensional repetition of a certain pattern unit called a "unit cell". When the periodicity of a pattern extends throughout a certain piece of material, one speaks of a single crystal. A single crystal is formed by the growth of a crystal nucleus without secondary nucleation or impingement on other crystals. See, e.g., page 389 of Volume 12 of the McGraw Hill Encyclopedia of Science & Technology, (McGraw Hill Book Company, New York, 1977).

By comparison, the term "polycrystal" refers to a material composed of various oriented crystals. The effects of a substrate upon the crystal growth of a material deposited upon it are discussed in Russel J. Hill's "Physical Vapor Deposition" (Temscal Division of the BOC Group, Inc., Berkeley, Calif., 1986). See, for example, the discussion of epitaxial growth appearing on pages 75, 76, and 112 of this book.

Referring again to FIG. 1, once vapor 44 is condensed on substrate 46, film 48 is formed.

Temperature sensing means 52 may be utilized to measure the temperature of substrate 46. Any temperature sensing means known to those skilled in the art can be utilized. Thus, by way of illustration, one may use temperature sensing means described in "The Temperature Handbook—Omega Complete Temperature Measurement Handbook and Encyclopedia Volume 27", published by Omega Engineering, Inc., Stamford, Conn. (1989).

In one embodiment, a type S thermocouple purchased from Omega Engineering, Inc., Stamford, Conn., is utilized.

Referring again to FIG. 1, heating element assembly 50 may be utilized to increase the temperature of substrate 46. In one embodiment, heating element assembly 50 is utilized to increase the temperature of substrate 46, from 200 degrees centigrade to 1,200 degrees centigrade and, preferably, from about 400 to about 600 degrees centigrade. In another preferred embodiment, the temperature of substrate 46 is increased to 400 degrees centigrade before condensation of vapor 44. In yet another preferred embodiment, the temperature of substrate 46 is increased to 500 degrees centigrade before condensation of vapor 44. In yet another preferred embodiment, the temperature of substrate 46 is maintained at 550 degrees centigrade during the deposition of vapor 44. In yet another preferred embodiment, the temperature of substrate 46 is maintained at 650 degrees centigrade during the deposition of vapor 44.

In one embodiment, the temperature of substrate 46 is increased to 750 degrees centigrade and maintained at 750 degrees centigrade for 30 minutes, after film 48 is formed. In yet another preferred embodiment, the temperature of substrate 46 is increased to 900 degrees centigrade and maintained at 900 degrees centigrade for 30 minutes, after film 48 is formed.

Referring again to FIG. 1, mechanical shutter 54 may be inserted between plasma reactor 24 and substrate 46 to block unwanted vapor 44 at the beginning of the vapor formation.

FIG. 2 illustrates a preferred embodiment of a mist generating system which can be used in the process of applicant's invention. The reagents charged into misting chamber 12 will be sufficient to form a layer of the desired materials in the process.

Referring to FIG. 2, the solution 10 in misting chamber 12 is preferably caused to form mist 13.

In the embodiment shown in FIG. 2, ultrasonic nebulizer 14 is in direct contact with an intermediate medium 11. Through intermediate medium 11, the ultrasonic oscillation is then coupled to solution 10. Excited by the ultrasonic oscillation, mist 13 is generated.

In one preferred embodiment, intermediate medium 11 is distilled water. In another preferred embodiment, intermediate medium 11 is deionized water.

Referring again to FIG. 2, it is preferred that the ultrasonic power utilized with such ultrasonic vibration machine should be in excess of one Watt and more preferably, in excess of 10 Watts. In one embodiment, the ultrasonic power utilized in such machine exceeds 50 Watts.

During the time solution 10 is being caused to mist, it is preferred to provide carrier gas 16 through carrier gas inlet 18. When carrier gas 16 applies pressure to solution 10 and mist 13, carrier gas 16 is in contact with solution 10 and mist 13. It is preferred that a sufficient amount of carrier gas 16 be introduced into the system through carrier gas inlet 18, at a sufficiently high flow rate so that pressure in the mist chamber 12 is in excess of atmospheric pressure. Thus, for example, in one embodiment wherein chamber 12 has a volume of about 200 cubic centimeters, the flow rate of the carrier gas is from 100 to 150 milliliters per minute.

Substantially any gas may be utilized as carrier gas 16. In one preferred embodiment, a gas which facilitates the formation of plasma may be utilized as carrier gas 16. Thus, by way of illustration, one may utilize oxygen, air, argon, nitrogen, hydrogen, and the like. It is preferred that the carrier gas utilized be a compressed gas under a pressure in excess of 760 millimeters of mercury. In this embodiment, the use of the compressed gas facilitates the movement of the mist 13 from the misting chamber 12 to the plasma region 22 in FIG. 1, through misting outlet line 20.

Referring again to FIG. 2, housing 15 contains the ultrasonic nebulizer 14, intermediate medium 11, and misting chamber 12.

Figure 3:
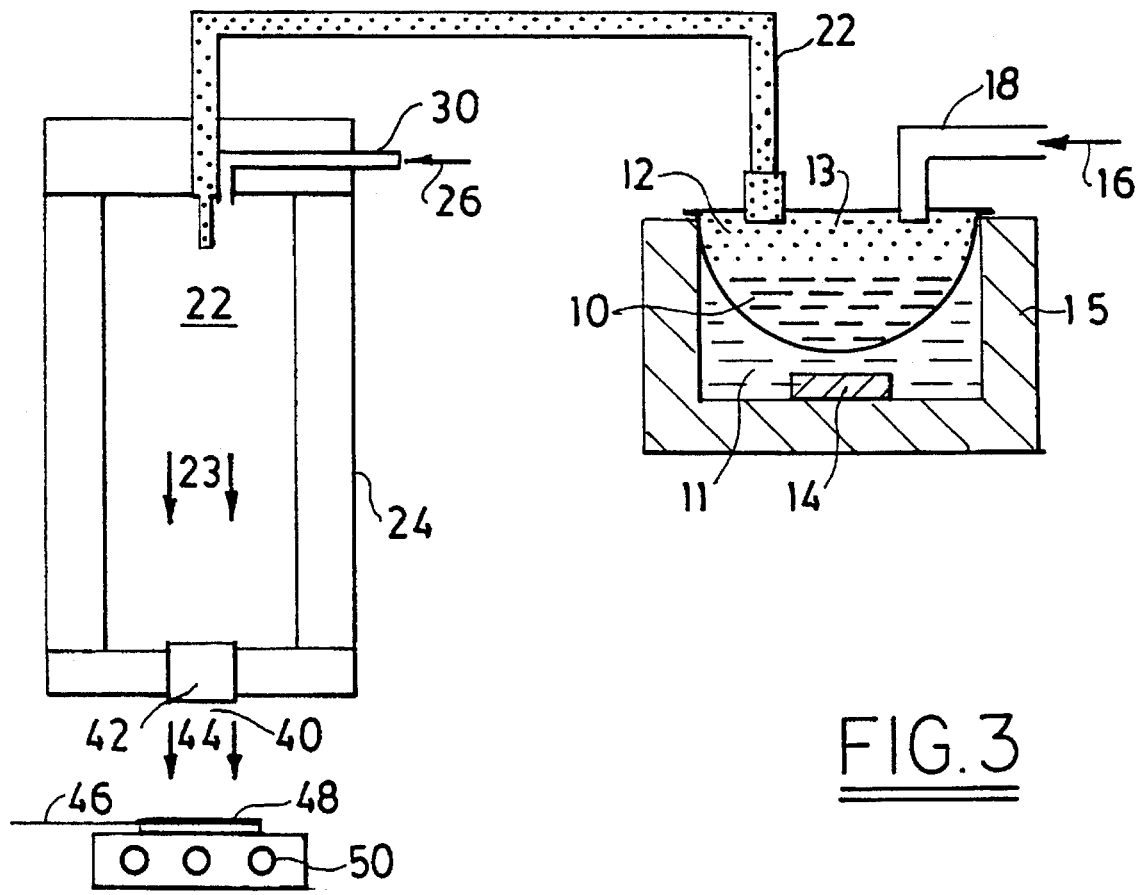
FIG. 3 is a schematic diagram illustrating a portion of another preferred embodiment of the invention.

FIG. 3 illustrates a preferred embodiment of the plasma coating system. The reagents charged into misting chamber 12 will be sufficient to form a layer of the desired materials in the process.

Referring to FIG. 3, the solution 10 in misting chamber 12 is preferably caused to form mist 13. In the embodiment shown in FIG. 3, the ultrasonic nebulizer 14 is in direct contact with an intermediate medium 11. Through intermediate medium 11, the ultrasonic oscillation is then coupled to solution 10. Excited by the ultrasonic oscillation, mist 13 is generated.

In a preferred embodiment, intermediate medium 11 is distilled water. In another preferred embodiment, intermediate medium 11 is deionized water.

During the time solution 10 is being caused to mist, it is preferred to provide carrier gas 16 through carrier gas inlet 18. When carrier gas 16 applies pressure to solution 10 and mist 13, carrier gas 16 is in contact with solution 10 and mist 13. It is preferred that a sufficient amount of carrier gas 16 be introduced into the system through carrier gas inlet 18, at a sufficiently high flow rate, so that pressure in the mist chamber 12 is in excess of atmospheric pressure. Thus, for example, in one embodiment wherein chamber 12 has a volume of about 200 cubic centimeters, the flow rate of the carrier gas is from 100 to 150 milliliters per minute.

Substantially any gas may be utilized as carrier gas 16. In one preferred embodiment, a gas which facilitates the formation of plasma may be utilized as carrier gas 16. Thus, by way of illustration, one may utilize oxygen, air, argon, nitrogen, hydrogen, and the like. It is preferred that the carrier gas utilized be a compressed gas under a pressure in excess 760 millimeters of mercury (and, preferably, from about 780 to about 850 millimeters of mercury). In this embodiment, the use of the compressed gas facilitates the movement of the mist 13 from the misting chamber 12 to the plasma region 22 of plasma reactor 24, through misting outlet line 20.

Referring again to FIG. 3, housing 15 contains the oscillators of ultrasonic nebulizer 14, intermediate medium 11, and misting chamber 12.

In plasma reactor 24, mist 13 is mixed with plasma generated by plasma gas 26 and subjected to radio frequency radiation provided by a radio frequency coil (not shown).

Plasma reactor 24 provides energy to form plasma and to cause the plasma to react with mist 13. Plasma gas 26 is fed into feeding line 30.

In one preferred embodiment, plasma gas 26 is pure argon. In another embodiment, plasma gas 26 is a mixture of argon and oxygen. In yet another embodiment, plasma gas 26 is pure nitrogen. In yet another embodiment, plasma gas 26 is a mixture of nitrogen and oxygen.

Referring again to FIG. 3, radio frequency energy is applied to the reagents in the plasma reactor 24, and it causes vaporization of the mist. Plasma vapor 23 formed in plasma reactor 24 is allowed to exit via aperture 42 and can be visualized in flame region 40. In this region, the plasma contacts air which is at a lower temperature than that of plasma region 22, and a flame is visible.

Vapor 44 present in flame region 40 is propelled downward towards substrate 46. Any material onto which vapor 44 will condense may be utilized as a substrate. Thus, by way of illustration, one may use materials such as, metal, ceramic, glass, plastic, and the like.

Once vapor 44 is condensed on substrate 46, film 48 is formed.

In one embodiment, heating element assembly 50 is utilized to increase the temperature of substrate 46, from 200 degrees centigrade to 1,200 degrees centigrade.

Figure 4:
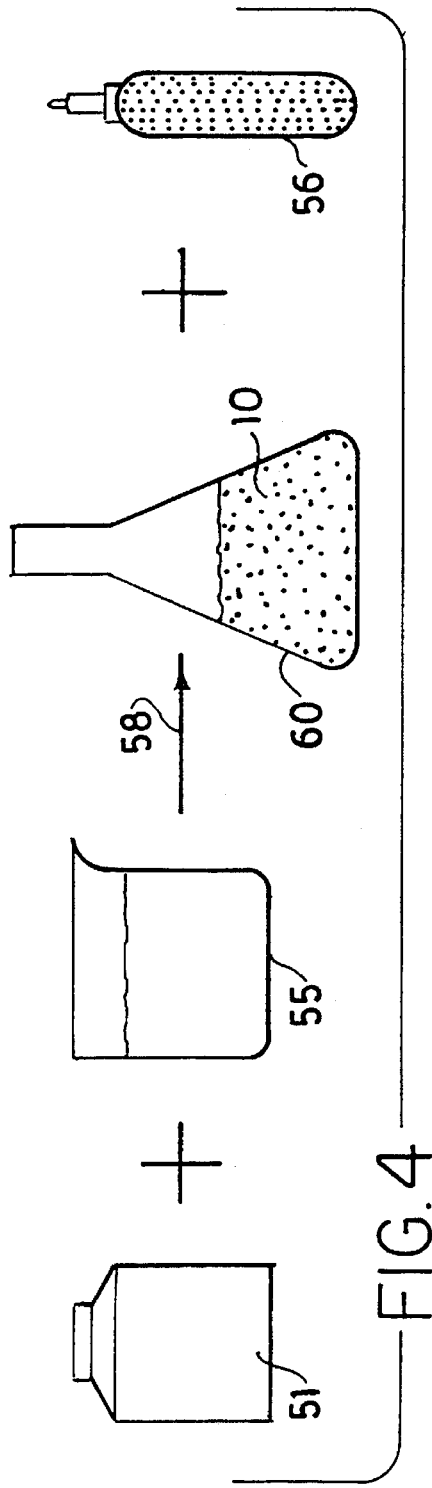
FIG. 4 is a schematic diagram illustrating a preferred means for preparing the solution used in the process of the invention.

FIG. 4 illustrates a preferred process for preparing the solution 10 which may be used in the processes depicted in FIGS. 1, 2, and 3.

In one embodiment, the desired coating contains one or more metal oxides. For such a metal oxide coating, the precursor 51 will contain the desired metal compound, which may be present in the form of a metal salt, a metal oxide, a suspension of metal salt(s) and/or metal oxide(s), mixtures thereof, or in another form.

In this embodiment, the metal compound precursor 51 is preferably mixed with water 55 (or other solvent), to produce a solution 10 via line 58. In a preferred embodiment, solvent 55 is distilled water. In another preferred embodiment, solvent 55 is deionized water.

In a preferred embodiment, a small amount of acid 56 is added into the aqueous mixture of precursor 51 and water 55, to increase the solubility of the resultant solution 10.

In a preferred embodiment, solution 10 is prepared and stored in a solution container 60.

In another preferred embodiment, precursor 51 is $SnCl_4 \cdot 5H_2O$, which is sold by Aldrich Chemical Company, Inc., Milwaukee, Wis. (1990/1991 Catalog No. 24,467-8), water 55 is distilled water, and acid 56 is hydrochloric acid sold by the aforementioned Aldrich Chemical Company, Inc., (1990/1991 Catalog No. 33,925-3).

In yet another preferred embodiment, precursor 51 is $InCl_3$ (Aldrich 1990/1991 Catalog No. 20,344-0), water 55 is distilled water, and acid 56 is hydrochloric acid.

In yet another preferred embodiment, precursor 51 is indium nitrate pentahydrate (Aldrich Catalog No. 32,612-7), water 55 is distilled water, and acid 56 is nitric acid (Aldrich Catalog No. 22,571-1).

In one embodiment, precursor 51 is a mixture of bismuth nitrate pentahydrate (Aldrich Catalog No. 25,415-0), lead nitrate (Aldrich Catalog No. 20,358-0), strontium nitrate (Aldrich Catalog No. 20,449-8), calcium nitrate tetrahydrate (Aldrich Catalog No. 23,712-4), and copper nitrate hemipentahydrate (Aldrich Catalog No. 22,339-5), water 55 is distilled water, and acid 56 is nitric acid.

In another embodiment, precursor 51 is a mixture of yttrium nitrate pentahydrate (Aldrich Catalog No. 23,795-7), and zirconium nitrate (Aldrich Catalog No. 25,734-6).

In yet another embodiment, precursor 51 is a mixture of nickel nitrate hexahydrate (Aldrich Catalog No. 20,387-4), and ferric nitrate nonahydrate (Aldrich Catalog No. 25,422-3).

In yet another embodiment, precursor 51 is a mixture of lanthanum nitrate hexahydrate (Aldrich Catalog No. 33,193-7), strontium nitrate (Aldrich Catalog No. 20,449-8), and manganese nitrate hexahydrate (Aldrich Catalog No. 28,864-0).

In another embodiment, precursor 51 is a mixture of nickel nitrate hexahydrate, (Aldrich Catalog No. 20,387-4), yttrium nitrate pentahydrate (Aldrich Catalog No. 23,795-7) and zirconium nitrate (Aldrich Catalog No. 25,734-6).

In yet another embodiment, precursor 51 is a mixture of barium nitrate (sold by Fisher Scientific Co., Pittsburgh, Pa., 1993/1994 Catalog No. B53-500), calcium nitrate tetrahydrate (Fisher Catalog No. C109-500), and copper nitrate hemipentadyrate (Fisher Catalog No. C467-500).

In yet another embodiment, precursor 51 is a mixture of barium nitrate (Fisher Catalog No. B53-500), calcium nitrate tetrahydrate (Fisher Catalog No. C109-500), copper nitrate hemipentahydrate Fisher Catalog No. C467-500), and silver nitrate (Fisher Catalog No. S181-25).

In yet another embodiment, precursor 51 is a mixture of lead nitrate (Fisher Catalog No. L62-100), strontium nitrate (Fisher Catalog No. S549-100), and copper nitrate hemipentahydrate (Fisher Catalog No. C467-500).

In yet another embodiment, precursor 51 is cobalt nitrate hexahydrate (Aldrich Catalog No. 23,926-7).

In yet another embodiment, precursor 51 is manganese nitrate hexahydrate (Aldrich Catalog No. 28,864-0).

In yet another embodiment, precursor 51 is fumed silica (Aldrich 1994/1995 Catalog No. 38,126-8) with a particle size of approximately 0.007 microns.

In yet another embodiment, precursor 51 is organic tetraethyl orthosilicate (TEOS) solution, sold by the Interstate Foundry Products, Inc., 803 Wilson Ave., Mercer, Pa.

Figure 5:
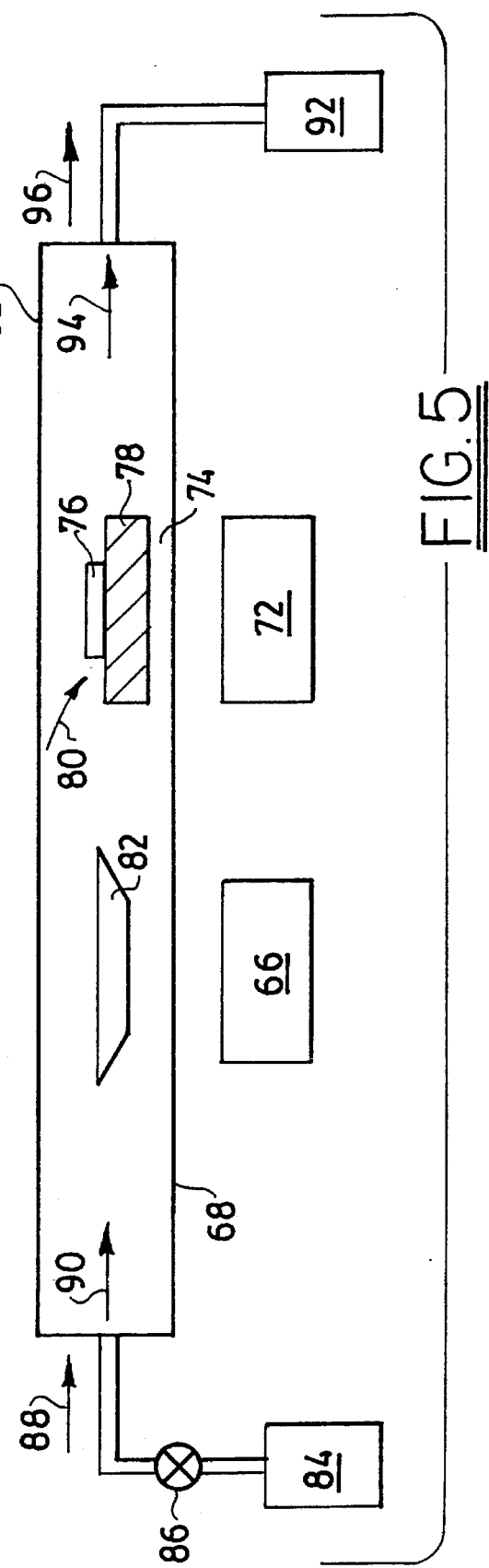
FIG. 5 is a schematic diagram of a heat-treating apparatus which can be used in the process of the invention.

FIG. 5 illustrates a preferred means for heat treating films after they have been plasma coated. In this embodiment, heat treatment chamber 62 may be heated by heaters 64 and 66 in a first temperature zone 68.

In another embodiment, heat treatment chamber 62 may be heated by heaters 70 and 72 in a second temperature zone 74. In this embodiment, plasma coated film 76 may be placed in such second temperature zone 74. To support film 76, a film holder 78 may be utilized. Thus, by means of illustration, in one embodiment film 76 is heat treated at a temperature of from about 500 to 1,200 degrees centigrade for from one to 12 hours and, preferably, is heat treated at a temperature of from about 700 to about 1,000 degrees centigrade for from about 3 to about 7 hours. In another embodiment, a temperature of 800 degrees centigrade is used for about 2 hours.

In yet another embodiment, a precursor 82 is heated in the first temperature zone 68 to produce a vapor 80, which interacts with film 76. Thus, e.g., plasma coated film 76 may be $Ba_2Ca_2Cu_3O_x$, and the precursor 82 is thallium oxide (sold by Aldrich as catalog number 20,461-7). In this embodiment, the temperature in the first temperature zone 74 is maintained at about 750 degrees centigrade for about 30 minutes, and the temperature in the second temperature zone 68 is maintained at 870 degrees centigrade for 30 minutes. After vapor 80 reacts with film 76, the resultant film is $TlBa_2Ca_2Cu_3O_9$. A description of this material may be found in an article by A. W. Sleight which is cited in the Wang patents referred to in the beginning of this specification.

Referring again to FIG. 5, gas 84 is supplied to heat treatment chamber 62 along the direction of arrow 88, via valve 86. In one embodiment, this gas enters chamber 62, moves along the direction of arrow 90, and reacts with film 76.

In yet another embodiment, the gas enters chamber 62, moves along the direction of arrow 90, and reacts with precursor 82.

In yet another embodiment, the gas enters chamber 62, moves along the direction of arrow 90, and reacts with both precursor 82 and film 76.

Referring again to FIG. 5, excess gas moves away from film 76, along the direction of arrow 94. After exiting chamber 62, the excess gas moves along the direction of arrow 96 and enters into gas safety handling facility 92.

Figure 6:
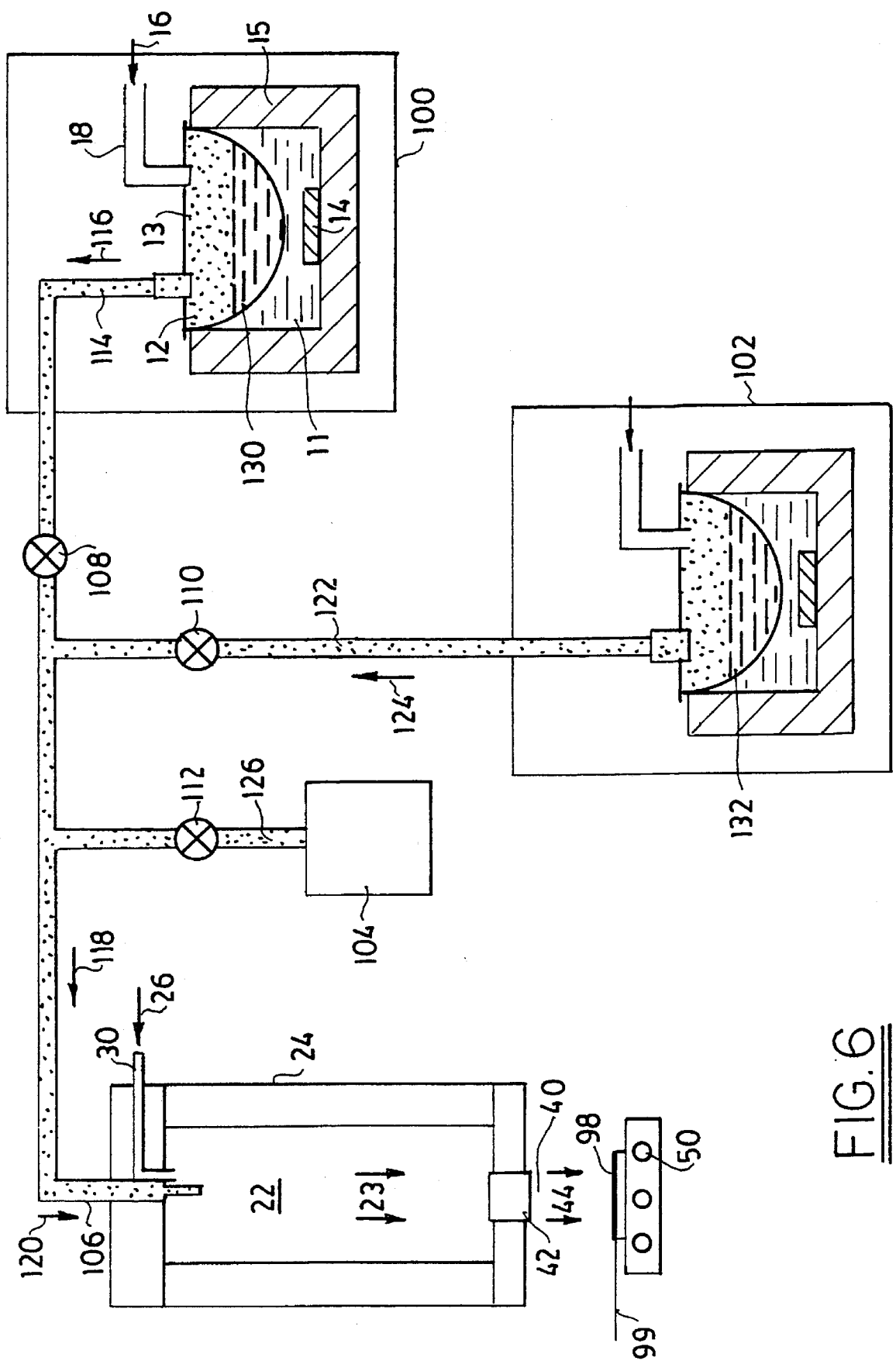
FIG. 6 is a schematic diagram of a portion of yet another preferred embodiment of the invention.

FIG. 6 illustrates a process for coating a multilayer film 98 onto substrate 99 via first misting assembly 100, second misting assembly 102, and/or third misting assembly 104.

Mist inlet 106 is inserted into plasma reactor 24. In one embodiment, first valve 108 may either allow or disallow the passage of first mist 114 supplied by first misting assembly 100. When first valve 108 opens, first mist 114 will be fed into mist inlet 106 along the directions of arrows 116, 118, and 120.

In another embodiment, second valve 110 may either allow or disallow the passage of second mist 122 supplied by second misting assembly 102. When second valve 110 opens, second mist 122 will be fed into mist inlet 106 along the directions of arrows 124, 118, and 120.

In yet another embodiment, a third valve 112 may either allow or disallow the passage of third mist 126 supplied by third misting assembly 104. When third valve 112 opens, a third mist 126 will be fed into mist inlet 106 along the directions of arrows 128, 118, and 120.

Referring again to FIG. 6, in one embodiment second misting assembly 102 is substantially the same as first misting assembly 100.

In yet another embodiment, the third misting assembly 104 is substantially the same as the second misting assembly 102.

In one embodiment, the first solution 130 is substantially different from the second solution 132 and, optionally, is also substantially different from a third solution (not shown) in third misting assembly 104.

In yet another embodiment, the second solution 132 is substantially different from such third solution. Furthermore, the first solution 130 may be substantially different from both the second solution 132 and the third solution.

Referring again to FIG. 6, in one embodiment, the first layer of film 98 is coated with materials from first solution 130, and a second layer of film 98 is coated with materials from second solution 132. Additionally, a third layer of film 98 may be coated with materials from a third solution (not shown) in third misting chamber 104.

Figure 7:
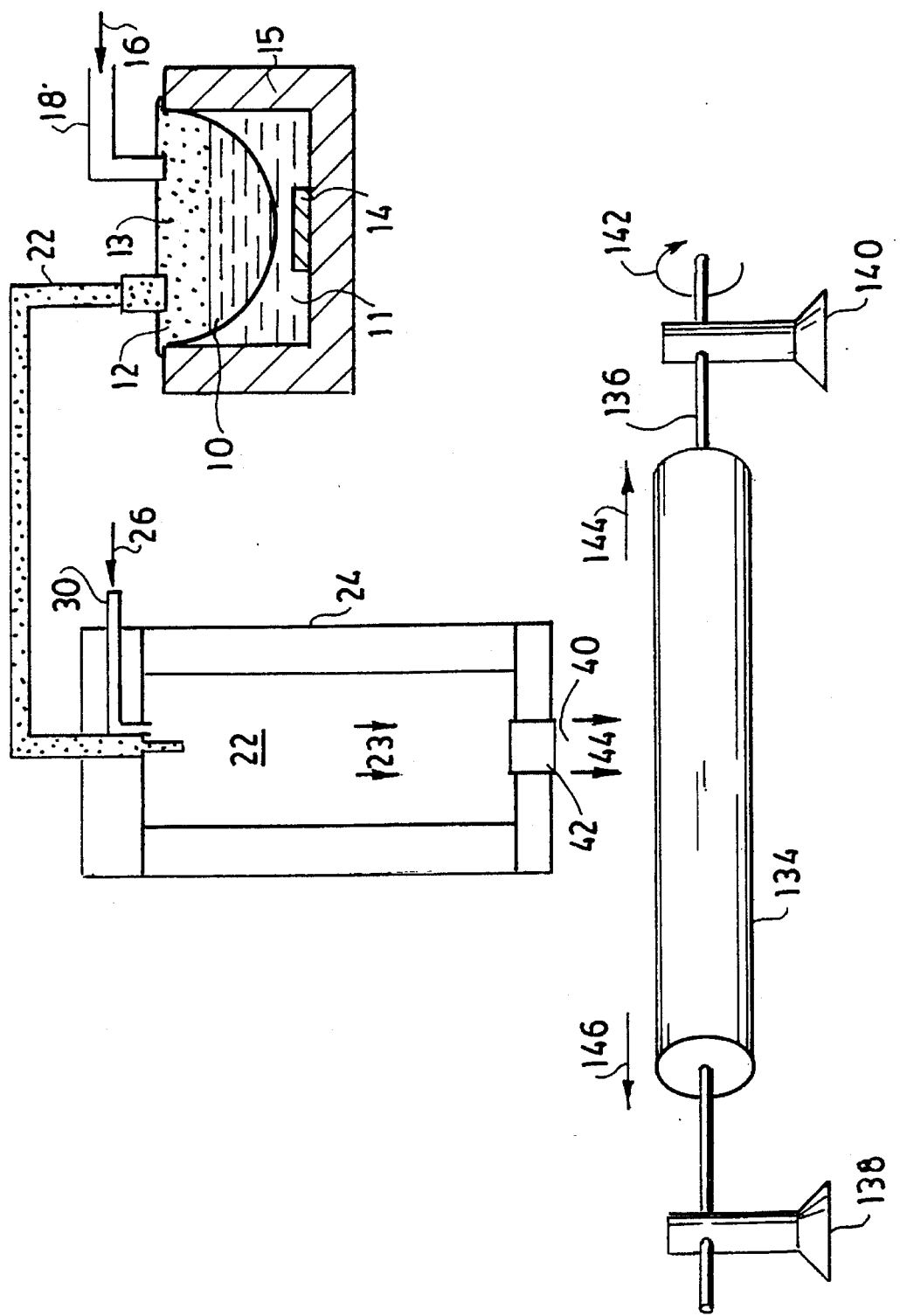
FIG. 7 is a schematic diagram of a portion of a preferred process adapted to coat tubular or fibrous substrates.

FIG. 7 illustrates a process for coating film onto a cylindrical tube 134. In one embodiment, a shaft 136 is inserted into tube 134. Shaft 136 is supported by left support 138 and right support 140. In one preferred aspect of this embodiment, tube 134 is rotated along the direction of arrow 142. In another aspect of this embodiment, tube 134 is pulled rightwards in the direction of arrow 144 or leftwards in the direction of arrow 146.

The following examples are presented to illustrate the claimed invention but are not to be deemed limitative thereof. Unless otherwise specified, all parts are by weight and all temperatures are in degrees centigrade.

EXAMPLE 1

7.5 grams of manganese nitrate hexahydrate (Aldrich catalog number 23,717-5, 1990/1991 catalog) were mixed with 100 milliliters of distilled water to form an aqueous solution with a concentration of 75 grams per liter. The solution was then poured into a hemispherical plastic mist chamber with a capacity of 200 cubic centimeters which was equipped with a gas inlet and a mist outlet.

The mist chamber containing the solution was placed onto the aforementioned DeVilbiss ultrasonic nebulizer generator described in the specification; the ultrasonic generator was operated at a power of 70 Watts and a frequency of 1.63 megahertz; the misting droplets formed were from 0.5 to 5.0 micrometers diameter in size. The gas inlet of the chamber was connected to a source of oxygen flowing at a rate of 100 milliliters per minute; the mist rate of the solution exiting the chamber was 2 milliliters per minute.

The output from the misting chamber was connected to the TAFA plasma reactor equipped with the Lepel radio frequency generator, both of which are described in the specification. The Lepel radio frequency generator was operated at a power of 30 killoWatts and produced an alternating current of 4 megahertz.

A mixture of oxygen and argon was introduced into the plasma reactor; the oxygen flow rate was 40 liters per minute, and the argon flow rate was 15 liters per minute. The distance between the plasma reactor and substrate was 13 centimeters.

The vapor from the plasma reactor deposited onto a glass microslide sold by VWR Scientific, Inc., San Francisco, Calif., (Catalog No. 48300-025). The size of the microslide was 2.5 centimeters by 7.5 centimeters. The substrate temperature was 500 degrees centigrade. The deposition rate was 1 micrometer per 30 minutes, on an area of 35 square centimeters. A coated object with a film thickness of 1 micrometer was obtained. The color of as-deposited film was brown.

The film so deposited was subjected to X-ray diffraction analysis on a Siemens D-500 Diffractometer (model number C72298-A223-B-9-POZ-228, manufactured by the Siemens Company of Germany, using copper K-alpha radiation and a diffracted beam graphite monochrometer. Analysis revealed that the dominant phase in the coating was manganese oxide (Bixbyite-C, JCPDS Card No. 31-825).

The film so deposited was subjected to Scanning Electron Microscopic (SEM) analysis. It was found that the grain sizes in the film were smaller than 0.1×0.1×0.1 micrometers.

The film so deposited was subjected to Energy Dispersive X-Ray analysis. It was found that the film contained manganese metal.

EXAMPLE 2

15 grams of cobalt nitrate hexhydrate (Aldrich 1990/1991 Catalog No. 23,037-5) were mixed with 200 milliliters of distilled water to form an aqueous solution with a concentration of 75 grams per liter. Thereafter, the procedure of Example 1 was substantially followed.

The film so deposited was subjected to X-ray diffraction analysis on the aforementioned Siemens D-500 Diffractometer. Analysis revealed that the dominant phase in the coating was cobalt oxide (JCPDS Card No. 9-418).

The film so deposited was subjected to the aforementioned Scanning Electron Microscopic (SEM) analysis. It was found that the grain sizes in the film were smaller than 0.1×0.1×0.1 micrometers.

The film so deposited was subjected to the aforementioned Energy Dispersive X-Ray analysis. It was found that the film contained cobalt metal.

EXAMPLE 3

22.5 grams of indium nitrate pentahydrate (Aldrich 1994/1995 Catalog No. 25,421-5) were mixed with 300 milliliters of distilled water to form an aqueous solution with a concentration of 75 grams per liter. Thereafter, the procedure of Example 1 was substantially followed.

The as-deposited film was transparent with a transmission in the visible range of close to 100%. The crystallite size of the particles in the film was about 11 nanometers.

The film so deposited was subjected to X-ray diffraction analysis, which revealed that the dominant phase in the coating was $In_2O_3$.

The film so deposited was subjected to the aforementioned Scanning Electron Microscopic (SEM) analysis. It was found that the grain sizes in the film were smaller than 0.1×0.1×0.1 micrometers, and the grain distribution was substantially uniform.

The film so deposited was subjected to the aforementioned Energy Dispersive X-Ray analysis. It was found that the film contained indium metal.

The resistivity of the film was 0.12 ohm-centimeters at room temperature.

EXAMPLE 4

The procedure of Example 1 was substantially followed, with the exception that the solution used was 7.5 grams of tin chloride pentahydrate (Fisher 1993/1994 catalog, number T137-100), and this material was dissolved in 100 milliliters of distilled water.

The transmission of the as-deposited film was 75 percent in the visible range. The crystallite size of the film was 6 nanometers. The dominant phase in the film was $SnO_2$. The grain sizes in the film were smaller than 0.1×0.1×0.1 micrometers, and the grain distribution was substantially uniform. Energy Dispersive X-Ray analysis revealed that the film contained tin metal.

EXAMPLE 5

The procedure of Example 4 was substantially followed with the exception that the solution concentration was 150 grams per liter and the mist rate was 4 milliliters per minutes. The deposition rate was 1 micrometer per 10 minutes, on an area of 35 square centimeters. A coated object with a film thickness of 1 micrometer was obtained.

The transmission of the as-deposited film was nearly zero percent in the visible range.

X-ray diffraction analysis revealed that the dominant phase in the coating was $SnO_2$.

Scanning Electron Microscope analysis revealed that the film morphology was "snowflake" like with the "flake" sizes of 1×1×1 micrometers.

The film was not electrically conductive.

Energy Dispersive X-Ray analysis revealed that the film contained tin metal.

EXAMPLE 6

The procedure of example 4 was substantially repeated with the exception that 7.5 grams of tin chloride pentahydrate (Fisher 1993/1994 Catalog No. T137-100) and 22.5 grams of indium nitrate pentahydrate (Aldrich 1994/1995 Catalog No. 25,421-5) were mixed with 400 milliliters of distilled water to form an aqueous solution with a concentration of 75 grams per liter.

The as-deposited film was transparent with transmission in the visible range close to 100%.

The X-ray diffraction analysis revealed that the dominant phase in the coating was indium oxide, with tin partially replacing indium sites.

The scanning electron microscope revealed that the grain sizes in the film were smaller than 0.1×0.1×0.1 micrometers. The size of the crystallites was 13 nanometers.

The Energy Dispersive X-Ray analysis revealed that the film contained both indium and tin metals.

The resistivity of the film was 1 ohm-centimeters at room temperature.

EXAMPLE 7

The procedure of example 6 was substantially repeated with the exception that the substrate heating elements were not utilized during deposition.

The as-deposited film was transparent with transmission in the visible range close to 100%.

The X-ray diffraction analysis revealed that the dominant phase in the coating was indium oxide with tin replacing some of the indium sites.

The scanning electron microscope revealed that the grain sizes in the film were smaller than 0.1×0.1×0.1 micrometers. The grains were substantially uniformly distributed The Energy Dispersive X-Ray analysis revealed that the film contained both indium and tin metals.

The resistivity of the film was 3 ohm-centimeters at room temperature.

EXAMPLE 8

The procedure of example 1 was substantially repeated with the exception that 1 gram of fumed silica (Aldrich 1994/1995 Catalog No. 38,126-8) was mixed with 100 milliliters of distilled water to form an aqueous solution with a concentration of 10 grams per liter.

The X-ray diffraction analysis revealed that the film had an amorphous phase.

The scanning electron microscope revealed that the grain sizes in the film were smaller than 0.2×0.2×0.2 micrometers.

The film so deposited was subjected to. Energy Dispersive X*ray analysis. It was found that the film contained silicon.

EXAMPLE 9

The procedure of example 9 was substantially repeated with the exception that 5 gram of fumed silica (Aldrich 1994/1995 Catalog No. 38,126-8) was mixed with 100 milliliters of distilled water to form an aqueous solution with a concentration of 50 grams per liter.

The X-ray diffraction analysis revealed that the film had a crystalline silica phase which is the same as the starting fumed silica.

The scanning electron microscope revealed that the grain sizes in the film were smaller than 0.5×0.5×0.5 micrometers.

The film so deposited was subjected to Energy Dispersive X-ray analysis. It was found that the film contained silicon.

EXAMPLE 10

The procedure of Example 1 was substantially followed, with the exceptions that the set up used in the FIG. 6 was utilized, and the substrate used was single-crystal magnesium oxide with dimensions of 1×1×0.5 centimeters. Referring to FIG. 6, the first misting assembly 100 was charged with a lead nitrate solution (Aldrich catalog number 20,358-0, at a concentration of 100 grams per liter), the second misting assembly 102 was charged with a strontium nitrate solution (Aldrich catalog number 20,449-8, at a concentration of 100 grams per liter), and the third misting assembly 104 was charged with a copper nitrate hydrate solution (Aldrich catalog number 22,963-6, at a concentration of 100 grams per liter).

During the coating operation, the first valve 108 was opened for 2 minutes, and then the second valve 110 was opened for 8 minutes. Thereafter the third valve 112 was opened for 12 minutes.

The film so deposited was subjected to scanning electron microscope analysis, which revealed that the film growth was columnar growth (when viewed cross-sectionally) with film thicknesses of 1 micrometer.

Energy dispersive x-ray analysis revealed that the film contained lead, strontium, and copper metals.

EXAMPLE 11

The procedure of Example 1 was substantially repeated with the exception that the starting solution was a mixture of barium nitrate ( sold by Fisher Scientific Co., Pittsburgh, Pa., 1993/1994 Catalog No. B53-500), calcium nitrate tetrahydrate (Fisher Catalog No. C109-500), and copper nitrate hemipentadyrate (Fisher Catalog No. C467-500), in the stoichiometric ratio of 2 moles of the barium metal, to 2 moles of the calcium metal, to 3 moles of the copper metal; the concentration of the solution was 100 grams per liter.

The film so deposited was subjected to scanning electron microscope analysis, which revealed that the film growth was agglomerate growth, with film thicknesses of 1 micrometer.

Energy Dispersive X-ray analysis revealed that the film contained barium, calcium, and copper metals.

EXAMPLE 12

The film produced in the experiment of Example 11 was treated in a two-zone furnace illustrated in FIG. 5. The precursor 82 in FIG. 5 was thallium oxide (Aldrich 1994/1995 catalog number 20,461-7). The temperature in the first temperature zone 68 was 750 degrees centigrade, and this temperature was maintained for 30 minutes. The temperature in the second temperature zone 74 was maintained at 870 degrees centigrade for 10 minutes. After the thallium vapor 80 reacted with film 76, the resultant film was superconductive $TlBa_2Ca_2Cu_3O_9$, as revealed by X-ray diffraction analysis. The critical temperature of the superconductor was 105 degrees Kelvin.

EXAMPLE 13

The procedure of example 1 was substantially repeated with the exception that the starting solution was $Bi_2Pb_{0.4}Sr_{2.1}Ca_{2.2}Cu_{4.5}$ nitrate, the substrate was single crystal magnesium oxide with a rough surface and without clear cleavage, and the substrate temperature was 835 degrees centigrade.

Figure 8:
FIGS. 8, 9, 10, and 11 are each a scanning electron micrograph of products produced by the process of the invention.

The film produced was superconductive $Bi_2Sr_2Ca_2Cu_3O_{10}$, as revealed by X-ray diffraction analysis. The superconductive transition temperature was 105 degrees Kelvin. The critical current at 40 degrees Kelvin was 200 amperes per square centimeter. The crystal growth in the film was very irregular (see FIG. 8).

EXAMPLE 14

The procedure of example 13 was substantially repeated with the exception that the substrate is MgO single crystal with (100) cleavage.

Figure 9:
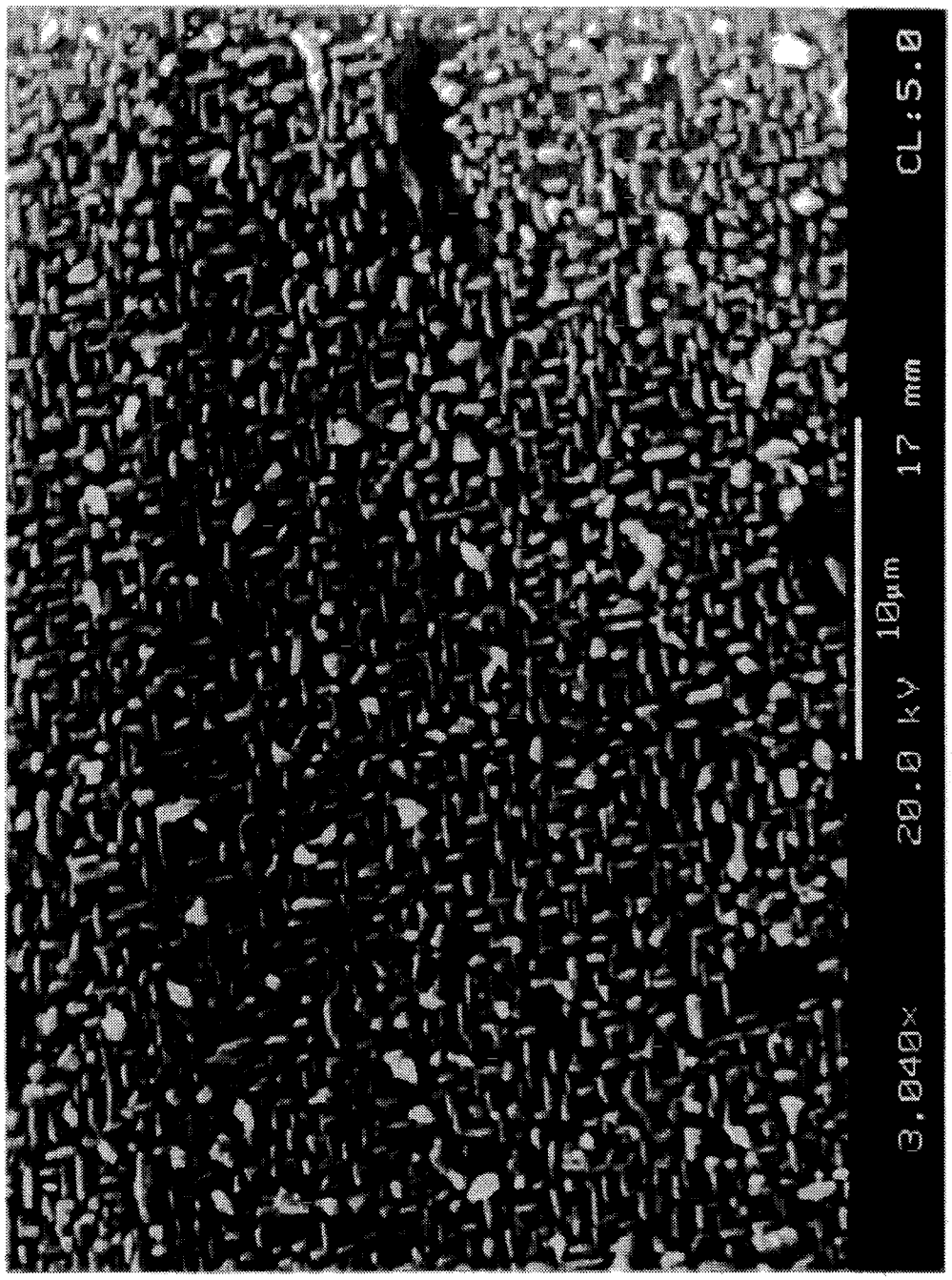

The film produced was also superconductive $Bi_2Sr_2Ca_2Cu_3O_{10}$, as revealed by X-ray diffraction analysis. However, the critical current at 40 degrees of Kelvin was 120,000 amperes per centimeters squared. As revealed by scanning electron microscope analysis (see FIG. 9), the crystal growth was very regular, with two preferred growth directions orthogonal to each other on the substrate plane.

EXAMPLE 15

The procedure of example 1 was substantially repeated with the exception that the starting solution was a mixture of yttrium nitrate and zirconium nitrate, the substrate was an anode disc (fabricated by Argonne National Laboratory, a mixture of nickel oxide and yttria stabilized zirconia, with diameter of 1.3 inches), and the substrate temperature was 800 degrees centigrade. The molar ratio of yttrium nitrate to zirconium nitrate was 0.152/0.848.

The film produced was $Y_{0.15}Zr_{0.85}O_{1.93}$ (JCPDS card No. 30-1468). However, the as-deposited film was not adhesive, and the deposits could be removed easily by external force.

EXAMPLE 16

The procedure of example 15 was substantially repeated with the exception that the substrate temperature was 1,100 degrees centigrade. The resultant film could withstand a tape lifting test, in which a Scotch Tape was first applied to the film and than lifted.

EXAMPLE 17

The procedure of example 15 was substantially repeated with the exception that the as deposited film was heat treated at 1,100 degrees centigrade for 6 hours. The post-annealed film withstood the tape lifting test.

EXAMPLE 18

The procedure of example 16 was substantially repeated with the following two exceptions: the film was deposited at a substrate temperature of 1,050 degrees centigrade, and the asdeposited film was heat treated at 1,100 degrees centigrade for 4 hours.

Figure 10:
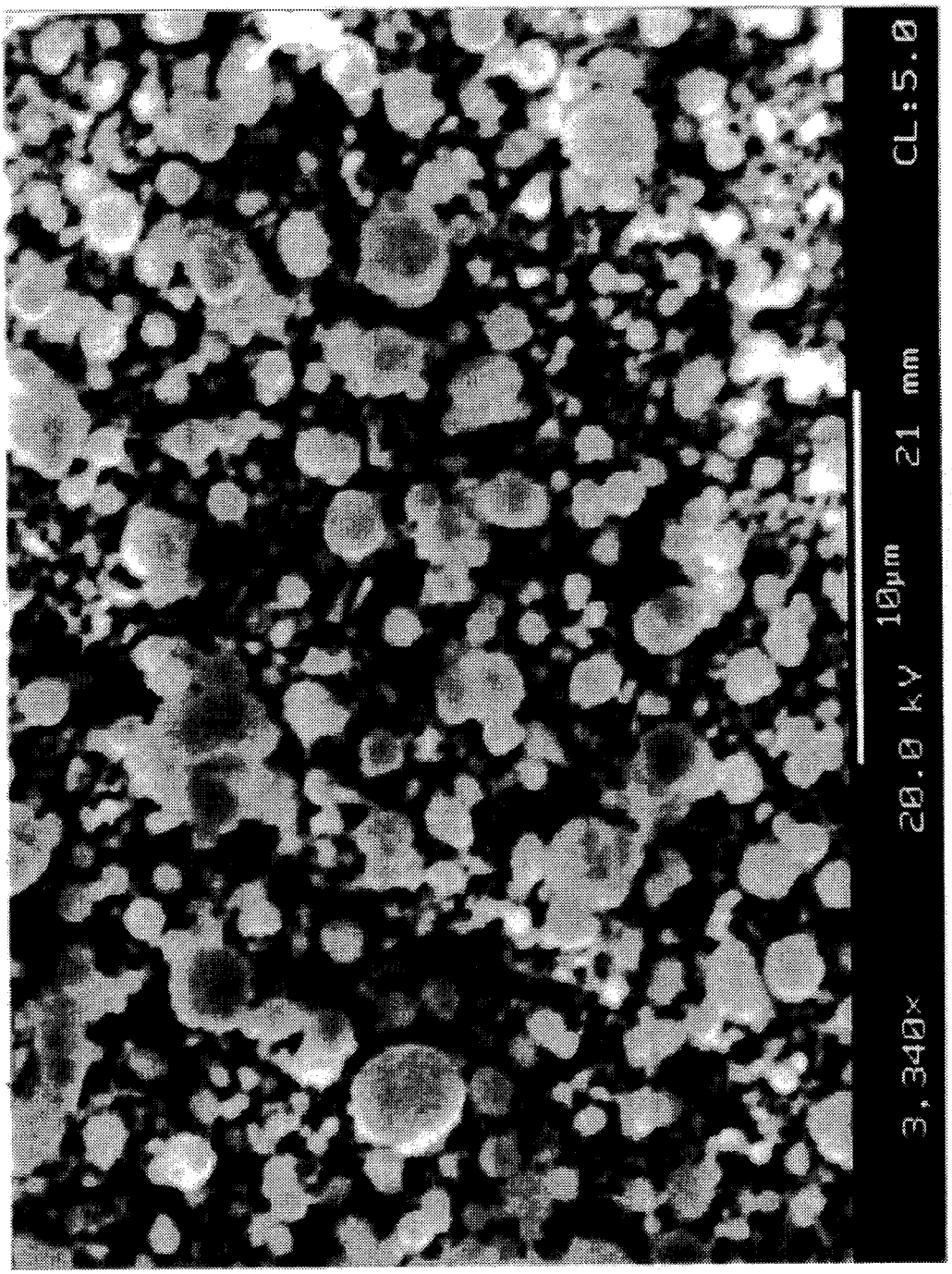

The post annealed film withstood the tape lifting test. However, the scanning electron microscope micrograph revealed that the film was not very dense, and the particle size distribution was not uniform (see FIG. 10).

EXAMPLE 19

The procedure of example 18 was substantially repeated with one additional step between the steps used in Example 18: the film was dipped into a solution containing yttrium nitrate hexahydrate and zirconium nitrate hydrate with a molar ratio of 0.17:0.95 and a solution concentration of 282 grams per liter.

Figure 11:
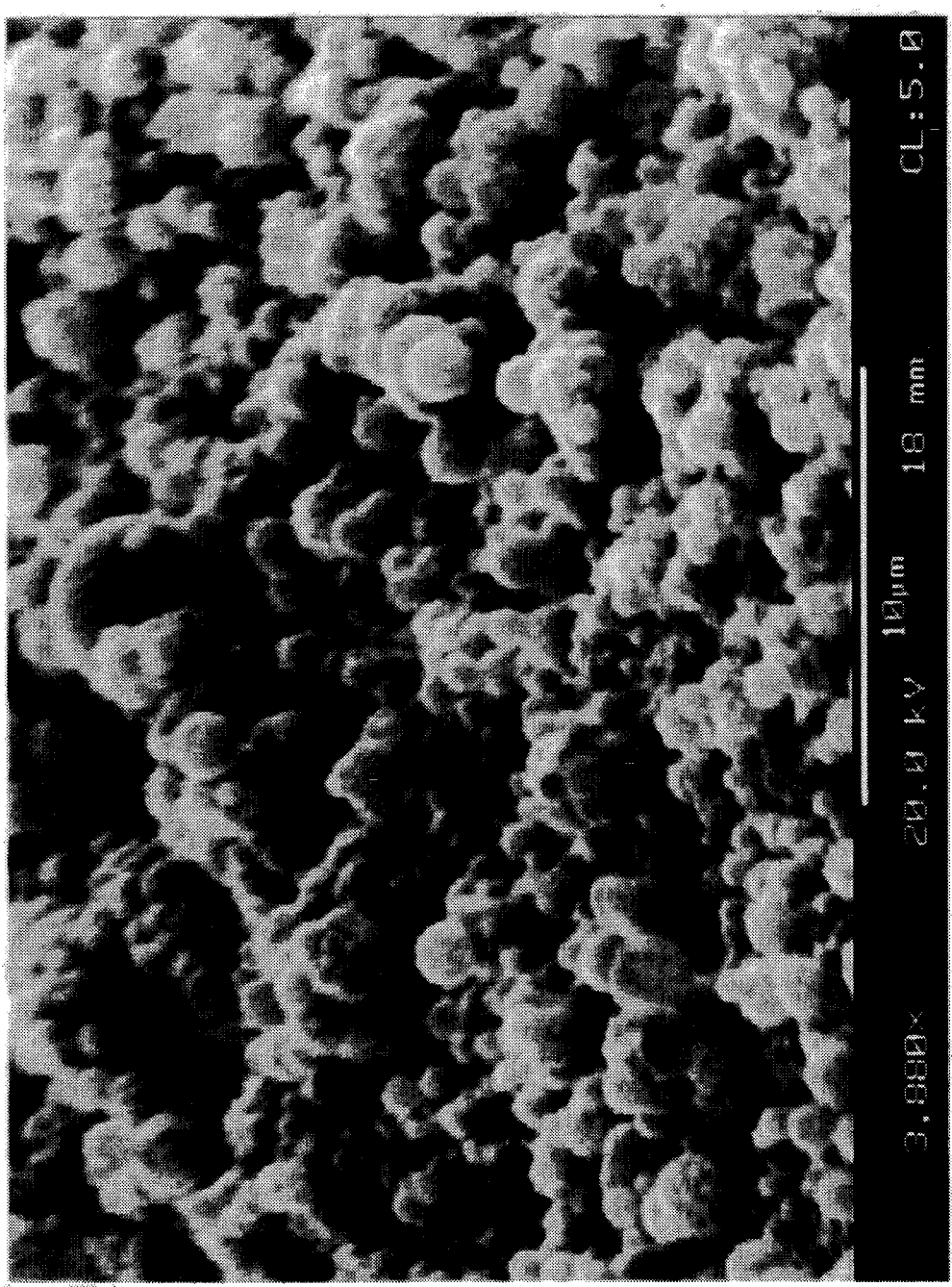

The heat-treated and wet-chemical treated film withstood the tape lifting test. The SEM micrograph revealed that the film was very dense, and the particle size distribution was uniform (see FIG. 11).

EXAMPLE 20

The procedure of Example 1 was substantially followed with the exception that the starting solution was a mixture of yttrium nitrate pentahydrate (Aldrich Catalog No. 23,795-7), zirconium nitrate (Aldrich Catalog No. 25,734-6), and nickel nitrate hexahdyrate (Aldrich Catalog No. 20,387-4), with Y:Zr:Ni being present in a molar ratio of 3.8/0.3/5.9.

As revealed by X-ray diffraction analysis, the film produced was a mixture of nickel oxide and yttria stabilized zirconia (JCPDS Cards Nos. 4-835 and 30-1468).

Scanning electron microscopic analysis indicated that the film was porous, with a porosity of approximately 65%.

EXAMPLE 21

The procedure in example 1 was substantially repeated with the exception that the starting solution was a mixture of lanthanum nitrate hexahydrate (Aldrich Catalog No. 33,193-7), strontium nitrate (Aldrich Catalog No. 20,449-8), and manganese nitrate hexahydrate (Aldrich Catalog No. 28,864-0), with the La:Sr:Mn molar ratios of 0.9/0.1/1.

As revealed by X-ray diffraction analysis, the film produced film was $La_{0.9}Sr_{0.1}MnO_3$ (JCPDS Card No. 40-1100).

As revealed by SEM microscopic study, the porosity of the film was approximately 60%.

EXAMPLE 22

The procedure of Example 1 was substantially repeated, with the exception that the starting solution used contained yttrium nitrate, barium nitrate, and copper nitrate in an yttrium/barium/copper molar ratio of 2/1/1. The substrate temperature used in the experiment of this example was 500 degrees centigrade. The film so produced contained $Y_2BaCuO_5$ with a crystallite size of 53 nanometers.

EXAMPLE 23

The procedure of Example 22 was substantially repeated, with the exception that the substrate temperature was 570 degrees centigrade. The film so produced contained $Y_2BaCuO_5$ with a crystallite size of 70 nanometers.

EXAMPLE 24

The procedure of Example 22 was substantially repeated, with the exception that the substrate temperature was 660 degrees centigrade. The film so produced contained $Y_2BaCuO_5$ with a crystallite size of 105 nanometers.

From these examples, and from the discussion of applicant's process in the earlier portions of this specification, it will be apparent to those skilled in the art that applicant's process provides a substantial amount of flexibility in producing products with a wide range of properties. This flexibility is illustrated in FIG. 12, which is a flow chart of one preferred process of the invention.

Figure 12:
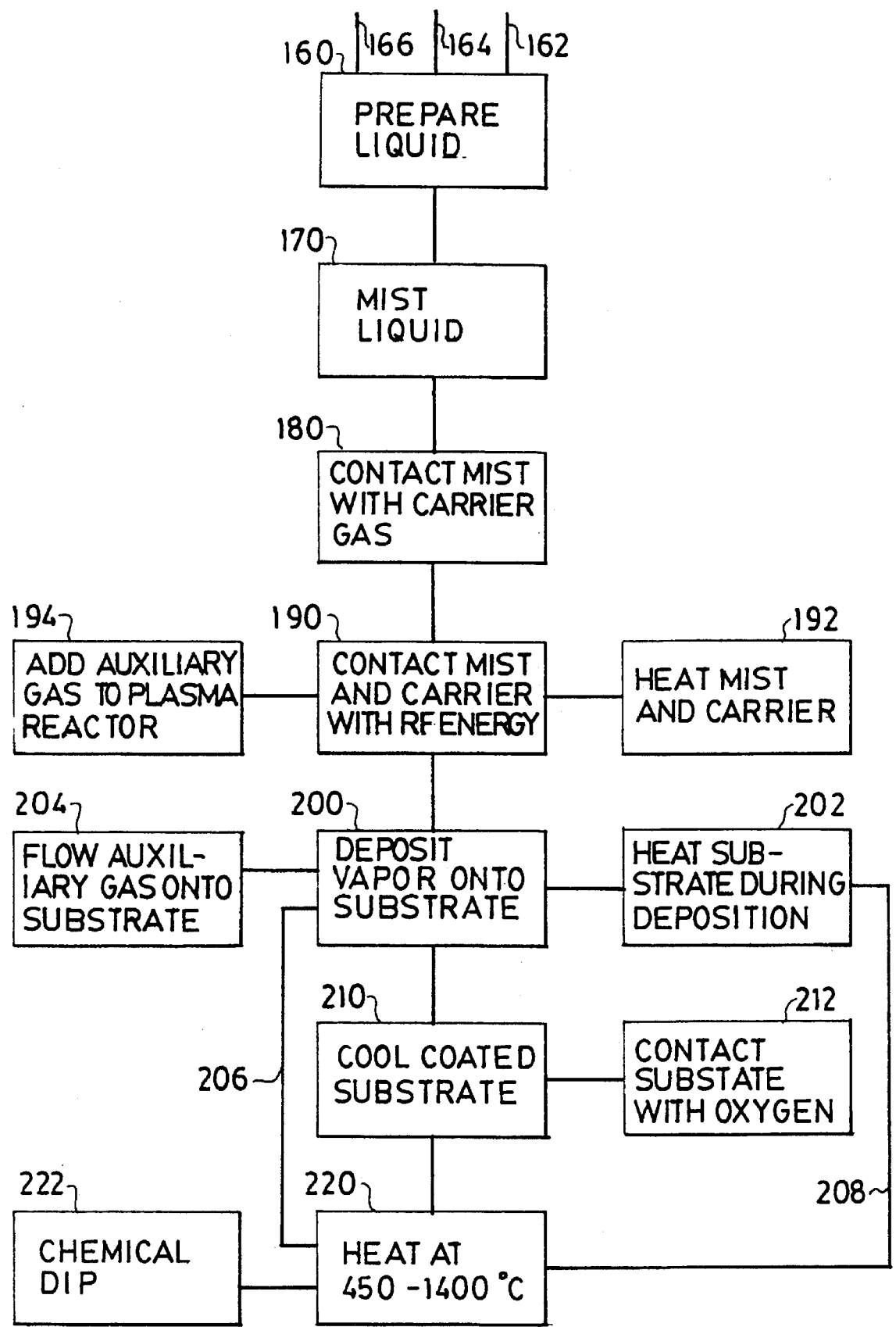
FIG. 12 is a flow diagram of certain preferred processes of the invention.

Referring to FIG. 12, in the first step of applicant's process, step 160, the liquid used in the system is prepared. This liquid, which may be in the form of a solution or a slurry of liquid and solid material, is preferably prepared by charging any necessary solid material via line 162, and/or any necessary liquid material via line 164, and/or any necessary other material(s) via line 166, to a mixer (not shown).

When the starting material is a slurry, it is preferred that it have a solids content (by total weight of solids and liquid in the slurry) of no greater than about 50 weight percent and, more preferably, no greater than about 30 weight percent. In this embodiment, it is preferred that the particle size of the particles in the slurry be such that at least about 95 weight percent of such particles are smaller than 5 microns and, more preferably, 1 micron.

When the starting material is a solution, it is preferred that the total concentration of solids material in the solution (number of grams of solid material used per liter of liquid material) be no greater than about 700 grams per liter of solvent mixed with the solids material and, more preferably, no greater than about 300 grams per liter of solvent(s) used. In one preferred embodiment, the concentration of the solution is from about 10 to about 100 grams per liter of solvent used.

The starting material may be a mixture of a solution with solid material slurried in it. In such a case, the total concentration of solids material in the solution/slurry mixture should be no greater than 700 grams per liter of solvent used and, more preferably, no greater than about 300 grams per liter of solvent used. In one embodiment, a concentration of from about 10 to about 100 grams per liter of solvent used is present.

In one preferred embodiment, where it is desired to create nanosized particles in the coating, the concentration of the solid material in the solution and/or slurry used should preferably be from about 0.1 to about 75 grams of solid material per liter of solvent used and, more preferably, should from about 1 to about 50 grams of solid material per liter of solvent used.

The preferred solvent is water, although one may use other solvents such as, e.g., organic solvents.

After the liquid is prepared in 160, it may be misted in step 170 by one or more of the means described in the specification. In general, at least about 95 volume percent of the mist particles should have a maximum dimension less than about 100 microns and, more preferably, less than about 20 microns.

It is preferred that the mist be formed at a rate of 0.1 to about 30 milliliters of liquid per minute. In one embodiment, the mist is formed at a rate of from about 1 to about 10 milliliters of liquid per minute.

In the next step of the process, step 180, the mist formed in step 170 is contacted with carrier gas and supplied at a pressure of from about 761 to about 850 millimeters of mercury absolute. It is preferred that the pressure of the carrier gas be from about 780 to about 810 millimeters of mercury in one embodiment.

In one preferred embodiment, where one desires to produce nanosized particles in the coating, the carrier gas used preferably is at a pressure of from about 761 to about 800 millimeters of mercury and, more preferably, is at a pressure of from about 765 to about 780 millimeters of mercury.

The carrier gas may be inert and take no part in reacting with the mist or in forming plasma. Alternatively, the carrier gas may be a plasma forming-gas such as, e.g., argon, nitrogen, helium, oxygen, hydrogen, mixtures thereof, and the like.

In one embodiment, it is preferred that the carrier gas be either argon, oxygen, or mixtures thereof.

The carrier gas/mist mixture is then contacted with radio-frequency energy, preferably in a plasma reactor where the mist may be heated during the formation of the plasma (see step 192). In general, it is preferred to heat the mist/carrier gas mixture to a temperature of at least about 100 degrees centigrade and, more preferably, at least about 2,000 degrees centigrade. In general, the mist/carrier gas mixture is heated to a temperature of from about 100 to about 10,000 degrees centigrade during this step.

It is preferred that the radio frequency energy used during this step is an alternating current waveform which has a specified power rating (the amount of power required to produce it). In general, at least about 3 kilowatts of power should be used to produce the radio frequency energy, which should have a frequency in excess of 1 megahertz. It is preferred that at least about 5 kilowatts of power be used to provide a radio frequency with a frequency higher than 3 megaHertz.

In one optional step, step 194, after the plasma is formed in plasma reactor, one or more auxiliary gases may be added in order to somehow modify or react with the vapor formed in the plasma reactor. Referring to FIG. 1, this auxiliary gas is preferably added between plasma region 22 and flame region 40.

In one preferred embodiment, the auxiliary gas is oxygen, or an oxygen-containing gas such as air. In this embodiment, from about 0.5 to about 2.0 atoms of oxygen are preferably introduced for each cation present in the plasma. It is more preferred to introduce from about 0.7 to about 1.2 atoms of oxygen for each cation present in the plasma. In one embodiment, from about 0.9 to about 1.1 atoms of oxygen are used for each cation present.

In the next step of the process, step 200, the hot vapor is deposited onto a substrate. One advantage of applicant's process is that it may be used to coat substrates which are flexible (such as ribbon), substrates which are in powder form (such as glass powder), substrates which are in fibrous form (such as glass fiber), substrates which are shaped in tubular form (such as a glass bottle), porous substrates (such as fuel cell anodes and cathodes), substrates which are dense (such as single crystals and polycrystals), substrates which are amorphous (such as glass as glass ceramic substrates), and the like.

It is not necessary to heat the substrate during the deposition of coating, but it is possible and, in some cases, desirable with oxide materials; see, e.g., pages 598–602 of James S. Reed's "Principles of Ceramic Processing", Second Edition (John Wiley & Sons, Inc., New York, 1995). Thus, as illustrated by step 202, during the vapor deposition the substrate may be heated to a temperature of from about 300 to about 1,200 degrees centigrade and, more preferably, to a temperature of from about 600 to about 800 degrees centigrade.

Alternatively, or additionally, one may in step 204 flow auxiliary gas (such as oxygen) directly onto or around the substrate.

The coated substrate is then cooled in step 210. In one embodiment, the substrate is allowed to cool to ambient without the imposition of heat or without contacting it with an external source of gas. Thereafter, the cooled substrate may be heat treated.

The heat-treatment cycle is illustrated in steps 220 et seq. in FIG. 12, after the cooling step. However, as has been discussed hereinabove, the heat treatment may be conducted directly after the film has been deposited onto the substrate (see line 206), and/or directly after heating it in step 202 (see line 208).

Referring again to FIG. 12, in the first step of the heat-treating process, step 210, the temperature of the substrate is (or maintained) at a temperature of from 450 to about 1,400 degrees Centigrade. If the temperature of the substrate must be raised or modified to achieve the desired temperature, it is preferred to do so at a rate of from about 1 to about 100 degrees per minute.

In a preferred embodiment, the temperature used in step 210 is from about 550 to about 1,100 degrees centigrade.

In step 210, the coated substrate is annealed for a period of from about 10 minutes to about 12 hours.

In another embodiment, where the coated substrate is comprised of superconductive metal oxides, the coated substrate is cooled at a rate of from about 1 to about 50 degrees per minute while optionally contacting it with oxygen or oxygen-containing gas flowing at rate of from about 1 to about 100 milliliters per minute (see step 212).

In another embodiment, where the coated substrate is comprised of glass, the coated substrate is cooled at a rate of from about 0.1 to about 10 degrees per minute.

In one embodiment, where highly dense coatings are desired, or where very highly adhesive coatings are desired, it is preferred in step 222 to dip the coated substrate into the solution prepared in step 160 (and/or into a similar solution with a higher concentration of solids) prior to the heat treatment.

In one embodiment, the concentration of the solid material(s) in the solution and/or slurry will be at least about 150 percent as great as that used in step 160 and, more preferably, at least about 400 percent as great as that used in step 160. In one embodiment, the concentration used in step 222 is at least about 1,000 percent as great as that used in the original solution prepared in step 160. Thus, by way of illustration, in one example the original concentration in step 160 was 70 grams per liter and the chemical dip had a concentration of 280 grams per liter.

Without wishing to be bound to any particular theory, applicant believes that the chemical dip fills peaks and valleys in the original coated film and that, after the heat treatment step 220, a substantially more uniform coating is produced.

The coated substrate of this invention

With applicant's process, one is able to produce a novel coated substrate with a unique combination of properties. This coated substrate has superior electrical conducting properties and superior mechanical strength; and it may thus be used in a variety of applications.

The coated substrate is comprised of a film coating with one or more layers. The total thickness of the film coating generally is preferably from about 0.1 to about 20 microns. Without wishing to be bound to any particular theory, it is believed that coatings with thicknesses outside of this range have poor adhesion properties and/or poor uniformity.

The coating is comprised of a multiplicity of particles which, in one preferred embodiment, are in the nanosize range. In this embodiment, it is preferred that least 95 weight percent of the particles in the coating have a maximum dimension of less than 100 nanometers and, preferably, have a minimum dimension of at least 5 nanometers.

In this embodiment, it is more preferred that at least about 95 weight percent of the particles in the coating have a maximum dimension of from about 20 to about 100 nanometers. In an even more preferred embodiment, at least about 95 weight percent of the particles in the coating have a size of from about 40 to about 80 nanometers.

In this embodiment, the resistivity of the deposited film is less than about 1,000 ohm-centimeters at ambient temperature and, preferably, is less than about 100 ohm-centimeters at ambient temperature. When the film is superconductive, the resistivity is preferably less than about 10 ohm-centimeters at ambient temperature.

The resistivity of the deposited film may be measured in accordance with the procedure described in a paper by M. Pistakis and X. W. Wang entitled "Automated Superconductor Measurement System," The Review of Scientific Instrumentation, 60(1), pages 135–136 (1989). This test, and the instrumentation used in it, is described in column 11 of U.S. Pat. No. 5,120,703, the disclosure of which is hereby incorporated by reference into this specification.

The coated substrate has a improved flexural strength, which is believed to be due to the presence of the nanometersized particles in the film. As is known to those skilled in the art, flexural strength is the maximum load sustained by a standard specimen of sheet material when subjected to a bending force. See, e.g., A.S.T.M. test C-11.

The coated substrate has an improved indentation hardness. As is known to those skilled in the art, the indentation hardness of a sample is the resistance to penetration by an indenter. See, e.g., A.S.T.M. D-1474-85. Reference also may be had to A.S.T.M. D-6, "Definitions of Terms Relating to Methods of Mechanical Testing".

The coated substrate also has improved plasticity properties because of the presence of the nanosized particles. As is known to those skilled in the art, plasticity is the property of a material to continue to deform indefinitely while sustaining a constant stress. See, e.g., A.S.T.M. C-136.

In one embodiment, the film coating has an optical transmission of at least about 80 percent of light in the visible spectrum. As is known to those skilled in the art, transmission is the passage of radiation through a medium without change of the frequency of the monochromatic components of which the radiation is composed. The transmittance of light is that fraction of the incident light of a given wavelength which is not reflected or absorbed, but passes through a substance. See, e.g., A.S.T.M. test E253, "Definitions of Terms Relating to Sensory Evaluation of Materials and Products."

In one preferred embodiment, the transmittance of the film is at least about 90 percent and, more preferably, at least about 99 percent.

The film coating of this invention also has an improved wear property. As is known to those skilled in the art, the wear rate of a material is the rate of material removal or dimensional change due to wear per unit of exposure parameter. See, e.g., A.S.T.M. tests G-2 ("Practice for Aqueous Corrosion Testing of Samples of Zirconium and Zirconium Alloys) and G-40 ("Terminology Relating to Erosion and Wear").

The film coating of this invention also has improved scratch-resistance. See, e.g., A.S.T.M. C162 ("Definitions of Terms Relating to Glass and Glass Products").

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

I claim:

1. A process for preparing a coated substrate, comprising the steps of:
   (a) creating mist particles from a liquid, wherein:
      1. said liquid is selected from the group consisting of a solution, a slurry, and mixtures thereof,
      2. said liquid is comprised of solvent and from 0.1 to 75 grams of solid material per liter of solvent,
      3. at least 95 volume percent of said mist particles have a maximum dimension less than 100 microns, and
      4. said mist particles are created from said first liquid at a rate of from 0.1 to 30 milliliters of liquid per minute;
   (b) contacting said mist particles with a carrier gas at a pressure of from 761 to 810 millimeters of mercury;
   (c) thereafter contacting said mist particles with alternating current radio frequency energy with a frequency of at least 1 megahertz and a power of at least 3 kilowatts while heating said mist particles to a temperature of at least about 100 degrees centigrade, thereby producing a heated vapor;

(d) depositing said heated vapor onto a substrate, thereby producing a coated substrate; and (e) subjecting said coated substrate to a temperature of from about 450 to about 1,400 degrees centigrade for at least about 10 minutes.

2. The process as recited in claim 1, wherein said solvent is water.

3. The process as recited in claim 2, wherein said liquid is comprised of water and from about 1 to about 50 grams of solid material per liter of water.

4. The process as recited in claim 3, wherein said carrier gas is selected from the group consisting of oxygen, argon, and mixtures thereof.

5. The process as recited in claim 3, wherein said carrier gas has a pressure of from about 765 to about 780 millimeters of mercury.

6. The process as recited in claim 5, wherein said alternating current radio frequency energy has a frequency of at least 3 megahertz and a power of at least 5 kilowatts.

7. The process as recited in claim 6, wherein said mist particles are heated to a temperature of at least 2,000 degrees centigrade.

8. The process as recited in claim 7, wherein said coated substrate is subjected to a temperature of from 550 to 1,100 degrees centigrade.

9. A process for preparing a coated substrate, comprising the steps of:

(a) creating mist particles from a first liquid, wherein:
1. said first liquid is selected from the group consisting of a solution, a slurry, and mixtures thereof,
2. said first liquid is comprised of solvent and from less than about 300 grams of solid material per liter of solvent,
3. at least 95 volume percent of said mist particles have a maximum dimension less than 100 microns, and
4. said mist particles are created from said first liquid at a rate of from 0.1 to 30 milliliters of liquid per minute;

(b) contacting said mist particles with a carrier gas at a pressure of from 761 to 850 millimeters of mercury;

(c) thereafter contacting said mist particles with alternating current radio frequency energy with a frequency of at least 1 megahertz and a power of at least 3 kilowatts while heating said mist particles to a temperature of at least about 100 degrees centigrade, thereby producing a heated vapor;

(d) depositing said heated vapor onto a substrate, thereby producing a coated substrate;

(e) exposing said coated substrate to a second liquid, wherein:
1. said second liquid is selected from the group consisting of a solution, a slurry, and mixtures thereof,
2. said second liquid is comprised of solvent,
3. said second liquid is comprised of at least about 1.5 times as much solid material as is said first liquid, whereby a dipped coated substrate is formed; and (f) subjecting said dipped coated substrate to a temperature of from about 600 to about 1,400 degrees centigrade for at least about 10 minutes.

10. The process as recited in claim 9, wherein said solvent is water.

11. The process as recited in claim 10, wherein said first liquid is comprised of water and from about 1 to about 50 grams of solid material per liter of water.

12. The process as recited in claim 11, wherein said carrier gas is selected from the group consisting of oxygen, argon, and mixtures thereof.

13. The process as recited in claim 12, wherein said carrier gas has a pressure of from about 765 to about 780 millimeters of mercury.

14. The process as recited in claim 13, wherein said alternating current radio frequency energy has a frequency of at least 3 megahertz and a power of at least 5 kilowatts.

15. The process as recited in claim 14, wherein said mist particles are heated to a temperature of at least 2,000 degrees centigrade.

* * * * *